United States Patent
Zhao et al.

(10) Patent No.: US 11,984,407 B2
(45) Date of Patent: May 14, 2024

(54) PACKAGE STRUCTURE AND COMMUNICATIONS DEVICE WITH SUPPRESSED ION MIGRATION IN BONDING MATERIAL

(71) Applicant: Huawei Technologies Co., Ltd., Shenzhen (CN)

(72) Inventors: Zhihua Zhao, Shanghai (CN); Mengyi Cao, Shanghai (CN); Kaizhan Wang, Shanghai (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 360 days.

(21) Appl. No.: 17/329,869

(22) Filed: May 25, 2021

(65) Prior Publication Data
US 2021/0280529 A1 Sep. 9, 2021

Related U.S. Application Data

(63) Continuation of application No. PCT/CN2018/117450, filed on Nov. 26, 2018.

(51) Int. Cl.
*H01L 23/552* (2006.01)
*H01L 23/66* (2006.01)

(52) U.S. Cl.
CPC ............ *H01L 23/552* (2013.01); *H01L 23/66* (2013.01)

(58) Field of Classification Search
CPC ............... H01L 23/552; H01L 23/66; H01L 2924/3025; H01L 2924/1421; H01L 2224/29339

USPC .......................................................... 257/659
See application file for complete search history.

(56) References Cited

U.S. PATENT DOCUMENTS

| | | | |
|---|---|---|---|
| 5,652,459 A | 7/1997 | Chen | |
| 2009/0212401 A1* | 8/2009 | Do | H01L 24/73 257/659 |
| 2010/0200967 A1* | 8/2010 | Karnezos | H01L 25/0657 257/E23.115 |
| 2013/0093081 A1 | 4/2013 | Lin | |
| 2014/0138834 A1 | 5/2014 | Pritiskutch et al. | |
| 2015/0364432 A1 | 12/2015 | Chung et al. | |
| 2017/0207190 A1* | 7/2017 | Tsukao | H01L 24/92 |

(Continued)

FOREIGN PATENT DOCUMENTS

| | | |
|---|---|---|
| CN | 1358813 A | 7/2002 |
| CN | 102217059 A | 10/2011 |
| CN | 102376654 A | 3/2012 |

(Continued)

*Primary Examiner* — Didarul A Mazumder
(74) *Attorney, Agent, or Firm* — Slater Matsil, LLP

(57) ABSTRACT

Embodiments of this application disclose a package structure and a communications device to which the package structure is applied. The package structure includes a substrate, a die, and a bonding layer configured to bond the die to the substrate. Charged particles are disposed in the bonding layer. An electrode is disposed on a surface of the die away from the bonding layer. A potential of the electrode is opposite to that of the charged particle. The package structure further includes a first shielding structure. A potential of the substrate is zero. The first shielding structure is located on an outer surface of the die and is located between the bonding layer and the electrode, to prevent the charged particles from migrating to the electrode.

20 Claims, 9 Drawing Sheets

(56) References Cited

U.S. PATENT DOCUMENTS

2018/0130722 A1\* 5/2018 Wall .................. H01L 23/49562

FOREIGN PATENT DOCUMENTS

| CN | 104241242 A | 12/2014 |
| CN | 104821359 A | 8/2015 |
| CN | 206148470 U | 5/2017 |
| JP | H05136141 A | 6/1993 |
| WO | 2016150583 A1 | 9/2016 |

\* cited by examiner

PACKAGE STRUCTURE AND COMMUNICATIONS DEVICE WITH SUPPRESSED ION MIGRATION IN BONDING MATERIAL

CROSS-REFERENCE TO RELATED APPLICATIONS

This application is a continuation of International Patent Application No. PCT/CN2018/117450, filed on Nov. 26, 2018. The disclosure of the aforementioned application is hereby incorporated by reference in its entirety.

TECHNICAL FIELD

This application relates to the field of communications technologies, and in particular, to a package structure in a communications device.

BACKGROUND

With development of wireless communications technologies, good heat dissipation needs to be provided for a package structure in a communications device. Using a power amplifier as an example, a power density of the power amplifier is increasingly high, and a working temperature also increases. Therefore, most power amplifiers use a material with good thermal conductivity as a bonding material between a die and a substrate, such as a gold-tin alloy or sintered silver. However, due to impact of a working environment, ions in the bonding material migrate. When the migrating ions combine with a charged electrode, the charged electrode is damaged, causing the charged electrode to fail or be short-circuited, resulting in poor reliability of the device. How to suppress ion migration in a bonding material is a direction of continuous researches in the industry.

SUMMARY

This application provides a package structure and a communications device, to implement a packaging solution of suppressing ion migration in a bonding material.

According to a first aspect, this application provides a package structure, where the package structure includes a substrate, a die, and a bonding layer configured to bond the die to the substrate, charged particles are disposed in the bonding layer, an electrode is disposed on a surface of the die away from the bonding layer, a potential of the electrode is opposite to that of the charged particle, the package structure further includes a first shielding structure, a potential of the substrate is zero, and the first shielding structure is located on an outer surface of the die and is located between the bonding layer and the electrode, to prevent the charged particles from migrating to the electrode.

In this application, the first shielding structure is disposed between the bonding layer and the electrode, and the first shielding structure can change distribution of electric fields between the bonding layer and the electrode, and block migration of the charged particles from a root, thereby protecting the electrode. In this design solution, no element or compound is added to a material of the bonding layer, and therefore, a consequence of a blocking failure that is of the bonding layer added with an element or a compound and that is caused by excessively long use of the bonding layer does not need to be worried.

In an implementation, the charged particles in the bonding layer are positive ions, the potential of the electrode on the surface of the die away from the bonding layer is negative, and the first shielding structure is connected to a zero potential in the package structure. The first shielding structure is connected to the zero potential in the package structure, the potential of the shielding structure is zero, and the potential of the substrate is also zero. There is no potential difference between the shielding structure and the substrate. Therefore, positively charged particles in the bonding layer do not move from the substrate to the shielding structure, so that migration of the charged particles toward the surface of the die is suppressed.

In an implementation, a die grounding element is disposed on the surface of the die away from the bonding layer, a potential of the die grounding element is zero, and the first shielding structure is connected to the die grounding element by using a leading wire. To be specific, a connection between the first shielding structure and the zero potential is completed. The leading wire and the die grounding element together form a barrier strip between the bonding layer and the electrode. In this implementation, the first shielding structure is formed in a manner of connecting the die grounding element by using the leading wire, and this is easily implemented from a perspective of a manufacturing process, provided that the leading wire is added, and the die grounding element is electrically connected by using the leading wire. The leading wire and the die grounding element together form the barrier strip. A potential of the barrier strip is zero. There is no potential difference between the shielding structure and the substrate, and this blocks migration of the charged particles.

In an implementation, there are two or more electrodes, there are a plurality of die grounding elements, the electrodes are disposed between adjacent die grounding elements at intervals, the leading wire of the first shielding structure is electrically connected between two adjacent die grounding elements, and the leading wire and the die grounding elements together enclose peripheries of the electrodes. Die grounding elements whose potentials are zero are disposed on two sides of each electrode, and the two adjacent die grounding elements are electrically connected by using the leading wire, to form the first shielding structure, and the potential of the first shielding structure is zero. According to another aspect, the first shielding structure encloses each electrode. To be specific, near each charged electrode, there is a first shielding structure corresponding to the charged electrode for enclosing the charged electrode. This design changes original distribution of electric fields between each charged electrode and the substrate, and blocks migration of the charged particles.

In an implementation, there are a plurality of electrodes, there are at least two die grounding elements, the electrodes and the die grounding elements are arranged in a same row, the die grounding elements include a first element and a second element respectively distributed at a row head and a row end, the leading wire is electrically connected between the first element and the second element, and the first element, the leading wire, and the second element together enclose peripheries of all the electrodes. Two die grounding elements are respectively disposed on head and tail ends of a same row on which electrodes are distributed, and the two die grounding elements are electrically connected by using the leading wire, to form the first shielding structure. On one hand, this design implements a grounding connection of the first shielding structure, and makes the potential of the first shielding structure zero, and on the other hand, a design of die grounding elements on head and tail ends implements enclosure of the first shielding structure on the entire row of electrodes, to change distribution of electric fields between the entire row of electrodes and the substrate, thereby blocking migration of charged particles.

In an implementation, the surface of the die away from the bonding layer includes a gate region, a drain region, and an active region, the active region is disposed between the gate region and the drain region, the electrodes and the die grounding elements are distributed in the gate region, the electrodes are gate electrodes in the gate region for inputting a radio frequency signal, a drain electrode is disposed in the drain region, and the drain electrode is used for outputting a radio frequency signal amplified by the active region. This implementation provides a specific application architecture, in which the package structure is applied to a power amplifier, to protect the gate electrodes.

In an implementation, the charged particles in the bonding layer are positive ions, the potential of the electrode on the surface of the die away from the bonding layer is negative, and the first shielding structure is connected to a positive potential in the package structure. The first shielding structure is connected to the positive potential in the package structure. The potential of the first shielding structure is positive. The potential of the substrate is zero. There is a potential difference between the first shielding structure and the substrate, so that an electric field pointing from the first shielding structure to the substrate is formed. The electric field makes positively charged particles in the bonding layer migrate toward the substrate, and not move toward the first shielding structure, thereby blocking migration of the charged particles toward the surface of the die.

In an implementation, the charged particles in the bonding layer are positive ions, the potential of the electrode on the surface of the die away from the bonding layer is negative, the first shielding structure is connected to a negative potential in the package structure, and a potential of the negative potential is lower than the potential of the electrode. The first shielding structure is connected to the negative potential in the package structure. The potential of the first shielding structure is negative. Moreover, in this case, it is required that the potential of the negative potential of the first shielding structure needs to be lower than the potential of the electrode. Therefore, a potential difference existing between the first shielding structure and the electrode forms an electric field pointing from the electrode to the first shielding structure. The charged particles run along a direction of an electric field. The potential of the substrate is zero. The potential of the first shielding structure is negative. A direction of the electric field between the substrate and the first shielding structure is from the substrate to the first shielding structure, and the charged particles migrate toward the first shielding structure. However, even if the charged particles move to a position of the first shielding structure, due to the direction of the electric field between the first shielding structure and the electrode, positively charged particles are suppressed from moving from the first shielding structure to the electrode, so that migration of the charged particles toward the surface of the die is blocked.

In an implementation, the charged particles in the bonding layer are negative ions, the potential of the electrode on the surface of the die away from the bonding layer is positive, and the first shielding structure is connected to a zero potential in the package structure. The first shielding structure is connected to the zero potential in the package structure, and the potential of the first shielding structure is zero. Therefore, there is no potential difference between the first shielding structure and the substrate. Negatively charged particles in the bonding layer do not move from the substrate to the first shielding structure, so that migration of the charged particles toward the surface of the die is suppressed.

In an implementation, the charged particles in the bonding layer are negative ions, the potential of the electrode on the surface of the die away from the bonding layer is positive, the first shielding structure is connected to a positive potential in the package structure, and a potential of the first shielding structure is higher than the potential of the electrode. The first shielding structure is connected to the positive potential in the package structure. The potential of the first shielding structure is positive. Moreover, the potential of the positive potential of the first shielding structure is higher than the potential of the electrode. Therefore, there is a potential difference between the first shielding structure and the electrode, so that an electric field pointing from the first shielding structure to the electrode is formed. The potential of the substrate is zero. An electric field pointing from the first shielding structure to the substrate is formed between the substrate and the first shielding structure. Negatively charged particles in the bonding layer migrate toward the first shielding structure under an effect of the electric field. However, because a direction of the electric field between the first shielding structure and the electrode is from the first shielding structure to the electrode, the direction of the electric field makes the negatively charged particles not move from the first shielding structure to the electrode, thereby blocking migration of the charged particles toward the surface of the die.

In an implementation, the charged particles in the bonding layer are negative ions, the potential of the electrode on the surface of the die away from the bonding layer is positive, and the first shielding structure is connected to a negative potential in the package structure. The first shielding structure is connected to the negative potential in the package structure, and the potential of the first shielding structure is negative. Therefore, there is a potential difference between the first shielding structure and the substrate, so that an electric field pointing from the substrate to the first shielding structure is formed. Then, under an effect of the electric field, negatively charged particles in the bonding layer move toward the substrate, and do not move toward the first shielding structure, so that migration of the charged particles toward the surface of the die is blocked.

In an implementation, the substrate includes an upper surface and a lower surface, the die is bonded to the upper surface by using the bonding layer, a pin is further disposed on the substrate, the pin extends from the upper surface to the lower surface, the pin is electrically connected to the electrode, the package structure further includes a second shielding structure, and the second shielding structure is disposed on the upper surface and is located between the bonding layer and the pin, to prevent the charged particles from migrating to the pin. The pin is configured to transmit a signal of the electrode to the lower surface of the substrate. The pin forms a pad on the lower surface of the substrate, to be electrically connected to another electronic element. The pin may be electrically connected to the electrode through wire bonding.

In this implementation, the second shielding structure is disposed between the bonding layer and the pin, and distribution of electric fields between the bonding layer and the pin is changed by using the second shielding structure, to block migration of the charged particles from a root, thereby protecting the pin and the electrode In an implementation, the charged particles in the bonding layer are positive ions, a potential of the pin is negative, and the second shielding structure is connected to a zero potential in the package structure. The second shielding structure is connected to the zero potential in the package structure. The potential of the second shielding structure is zero. In this case, the potential of the substrate is also zero. Therefore, there is no potential difference between the second shielding structure and the substrate. Positively charged particles in the bonding layer do not move from the substrate to the shielding structure, so that migration of the charged particles toward the pin is blocked.

In an implementation, a substrate grounding element is disposed on the upper surface, the second shielding structure includes a connecting line electrically connected to the substrate grounding element, and the connecting line and the substrate grounding element together form a barrier strip between the bonding layer and the pin. In the second shielding structure, a barrier strip is formed between the bonding layer and the pin through connection by using the connecting line. Because the barrier strip is the second shielding structure, there is no potential difference between the second shielding structure and the substrate, and there is no potential difference between the barrier strip and the substrate, so that the charged particles do not migrate between the barrier strip and the substrate.

In an implementation, there are a plurality of pins, there are at least two substrate grounding elements, the pins and the substrate grounding elements are arranged in a same row, the substrate grounding elements include a head element and an end element respectively distributed at a row head and a row end, the connecting line is electrically connected between the head element and the end element, and the head element, the connecting line, and the end element together enclose peripheries of all the pins. Two substrate grounding elements are respectively disposed on head and tail ends of a same row on which pins are distributed, and the second shielding structure is electrically connected to the two substrate grounding elements. On one hand, this design implements a grounding connection of the second shielding structure, and makes the potential of the second shielding structure zero, and on the other hand, a design of substrate grounding elements on head and tail ends implements enclosure of the second shielding structure on the entire row of pins, to change distribution of electric fields between the entire row of pins and the substrate, thereby blocking migration of charged particles.

In an implementation, the charged particles in the bonding layer are positive ions, a potential of the pin is negative, and the second shielding structure is connected to a positive potential in the package structure. The second shielding structure is connected to the positive potential in the package structure. The potential of the second shielding structure is positive. In this case, the potential of the substrate is zero. Therefore, there is a potential difference between the second shielding structure and the substrate, so that an electric field pointing from the second shielding structure to the substrate is formed. The electric field makes positively charged particles in the bonding layer not move from the substrate to the second shielding structure, thereby blocking migration of the charged particles toward the pin.

In an implementation, the charged particles in the bonding layer are positive ions, a potential of the pin is negative, the second shielding structure is connected to a negative potential in the package structure, and a potential of the negative potential is lower than the potential of the pin. The second shielding structure is connected to the negative potential in the package structure. The potential of the second shielding structure is negative. Moreover, in this case, it is required that the potential of the negative potential of the second shielding structure needs to be lower than the potential of the negative potential of the pin. Therefore, there is a potential difference between the second shielding structure and the pin, so that an electric field pointing from the pin to the second shielding structure is formed. The electric field makes positively charged particles in the bonding layer not move from the second shielding structure to the pin, thereby blocking migration of the charged particles toward the pin.

In an implementation, the charged particles in the bonding layer are negative ions, a potential of the pin is positive, and the second shielding structure is connected to a zero potential in the package structure. The second shielding structure is connected to the zero potential in the package structure, and the potential of the second shielding structure is zero. Therefore, there is no potential difference between the second shielding structure and the substrate. Negatively charged particles in the bonding layer do not move from the substrate to the second shielding structure, so that migration of the charged particles toward the pin is suppressed.

In an implementation, the charged particles in the bonding layer are negative ions, a potential of the pin is positive, the second shielding structure is connected to a positive potential in the package structure, and a potential of the positive potential is higher than the potential of the pin. The second shielding structure is connected to the positive potential in the package structure, the potential of the second shielding structure is positive, and the potential of the positive potential of the second shielding structure is higher than that of the pin. Therefore, there is a potential difference between the second shielding structure and the pin, so that an electric field pointing from the second shielding structure to the pin is formed. Then, under an effect of the electric field, negatively charged particles in the bonding layer do not move from the second shielding structure to the pin, so that migration of the charged particles toward the pin is blocked.

In an implementation, the charged particles in the bonding layer are negative ions, a potential of the pin is positive, and the second shielding structure is connected to a negative potential in the package structure. The second shielding structure is connected to the negative potential in the package structure, and the potential of the second shielding structure is negative. Therefore, there is a potential difference between the second shielding structure and the substrate, so that an electric field pointing from the substrate to the second shielding structure is formed. Then, under an effect of the electric field, negatively charged particles in the bonding layer do not move from the substrate to the second shielding structure, so that migration of the charged particles toward the pin is blocked.

In an implementation, the package structure includes a passivation layer, where the passivation layer covers the first shielding structure. Stability of a material of the first shielding structure is ensured by covering the passivation layer on a surface of the first shielding structure.

According to another aspect, the present invention provides a communications device, including a radio frequency passive device, a radio frequency small signal device, and the package structure in any one of the implementations mentioned above, where the package structure is connected between the radio frequency small signal device and the radio frequency passive device. By applying the package structure to the communications device, a problem of ion migration in the communications device can be resolved. Moreover, compared with a mainstream method for preventing ion migration, this is simpler in process, and reduces processing costs.

BRIEF DESCRIPTION OF THE DRAWINGS

To describe the technical solutions in embodiments of the present invention or in the conventional technology more clearly, the following briefly describes the accompanying drawings for describing the embodiments. Clearly, the accompanying drawings in the following descriptions show merely some embodiments of the present invention, and a person of ordinary skill in the art may still derive other drawings from these accompanying drawings without creative efforts.

DETAILED DESCRIPTION OF ILLUSTRATIVE EMBODIMENTS

The following describes the technical solutions in embodiments of the present invention with reference to the accompanying drawings in the embodiments of the present invention. Clearly, the described embodiments are merely some rather than all of the embodiments of the present invention. All other embodiments obtained by a person of ordinary skill in the art based on the embodiments of the present invention without creative efforts shall fall within the protection scope of the present invention.

Figure 1:
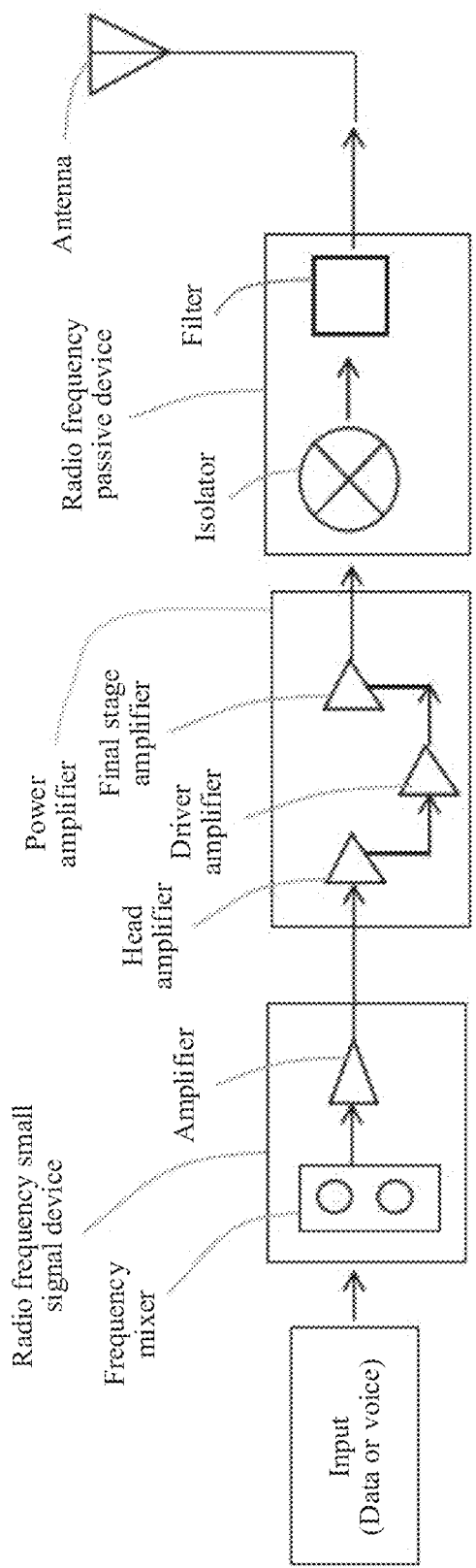
FIG. 1 is a schematic architectural diagram of a communications device according to an implementation of the present invention.

As shown in FIG. 1, a package structure provided in an embodiment of the present invention may be applied to a communications device. The communications device is a radio remote unit in a wireless communications base station. The radio remote unit (RRU) is generally divided into four big modules: a digital intermediate frequency module, a transceiver module, a power amplification module, and a filtering module. The digital intermediate frequency module is used for modulation and demodulation, digital up-down frequency conversion, A/D conversion, and the like for optical transmission. The transceiver module completes conversion from an intermediate frequency signal to a radio frequency signal. Then, the radio frequency signal is transmitted out by using an antenna port through the power amplification module and the filtering module.

The embodiments of the present invention relate to a package structure and a communications device having the package structure. The communications device is a radio remote unit in a wireless communications base station. The package structure is a power amplifier. A power amplifier located between a radio frequency small signal device and a radio frequency passive device in FIG. 1 to amplify a radio frequency signal includes the package structure provided in the present invention. Specifically, the power amplifier may be divided into a head amplifier, a driver amplifier, and a final stage power amplifier. The package structure in the embodiments of the present invention is applicable to any amplifier in the power amplifier, to resolve a problem of ion migration in the power amplifier.

In practice, to satisfy heat dissipation of the power amplifier, a bonding material is usually a sintered silver material. However, because silver ions have high water solubility, the sintered silver material easily migrates toward a negative voltage direction in a high-temperature, high-humidity, and electric field environment. A negative voltage exists in an actually used package structure. In a high-temperature and high-humidity environment, silver ions migrate under an effect of an electric field force. As a result, a pad of the power amplifier is short-circuited, affecting safety of a communications circuit.

Figure 2:
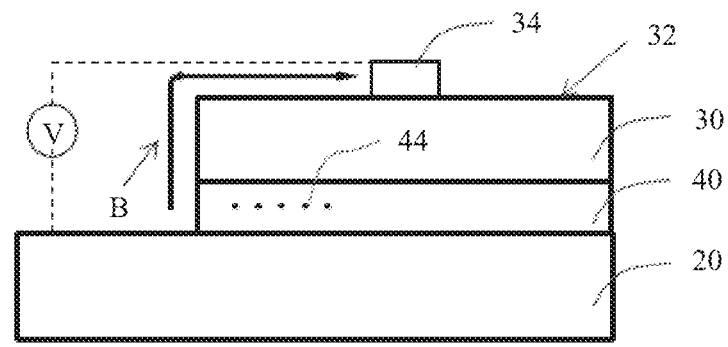
FIG. 2 is a schematic structural diagram of a package structure in the conventional technology.
Figure 3:
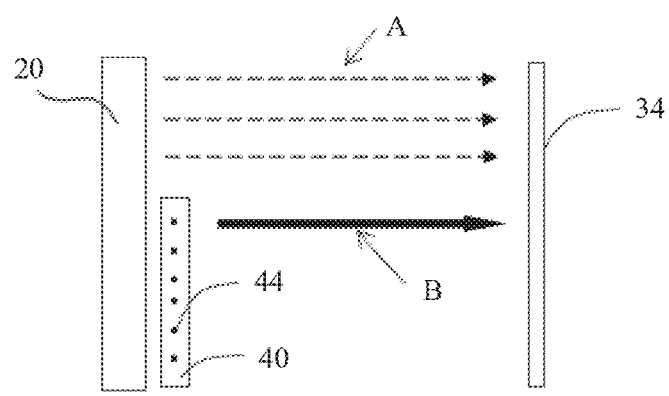
FIG. 3 is a diagram of distribution of electric fields of the package structure in the conventional technology.

As shown in FIG. 2 and FIG. 3, a package structure 100 includes a substrate 20, a die 30, and a bonding layer 40 configured to bond the die 30 to the substrate 20. There are positively charged silver ions 44 in the bonding layer 40. An electrode 34 is disposed on a surface 32 of the die 30 away from the bonding layer. A potential of the electrode 34 is opposite to that of the charged particle 42. Because the potential of the electrode 34 is negative, and a potential of the substrate 20 is zero, an electric field pointing from the substrate 20 to the electrode 34 (a direction is shown as A) is generated. The silver ions 44 generate movement (a direction of the movement is shown as B) under an effect of the electric field. Finally, a large quantity of silver ions 44 accumulate near the electrode 34. Consequently, the electrode 34 is damaged, and a safety hazard such as a short circuit is brought.

Figure 4:
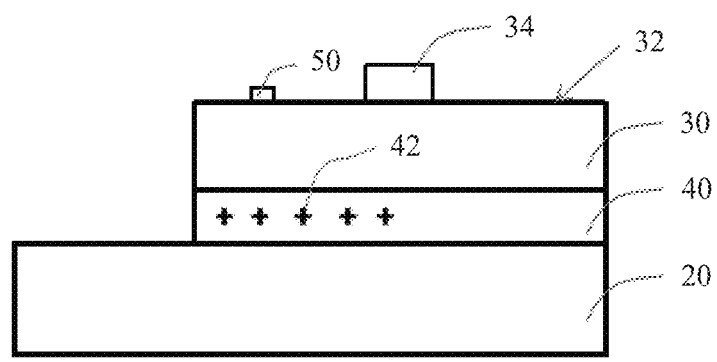
FIG. 4 is a schematic structural diagram of a package structure in an implementation of the present invention.

To avoid a short-circuit danger caused by ion migration in a package structure, the present invention provides a package structure with a shielding structure. As shown in FIG. 4, in an implementation, a package structure 100 includes a substrate 20, a die 30, and a bonding layer 40 configured to bond the die 30 to the substrate 20. The substrate 30, the bonding layer 40, and the die 30 are stacked from bottom to top. Charged particles 42 are disposed in the bonding layer 40, an electrode 34 is disposed on a surface 32 of the die 30 away from the bonding layer, and a potential of the electrode 34 is opposite to that of the charged particle 42. The package structure 100 further includes a first shielding structure 50, a potential of the substrate 20 is zero, and the first shielding structure 50 is distributed on an outer surface of the die 30 and is located between the bonding layer 40 and the electrode 34, to prevent the charged particles 42 from migrating to the electrode 34. In a specific implementation, based on settings of the potentials of the electrode 34 and the charged particles 42, the first shielding structure 50 makes a targeted selection of a positive potential, a negative potential, or a zero potential, to damage an electric field causing the charged particles 42 to move, and prevent migration and movement of the charged particles 42, thereby protecting the electrode 34 on the die 30, and ensuring reliability of the die.

GaN is usually selected as a material of the die 30. As a wide bandgap semiconductor, the GaN has a quite high breakdown electric field. It can be ensured that an active region of the die can have a sufficiently high power density, and a quite high power output in a high-temperature and high-voltage condition can still be ensured. In addition, the present invention is applicable to reliability guarantee of any die material, including but not limited to the GaN material.

Figure 5:
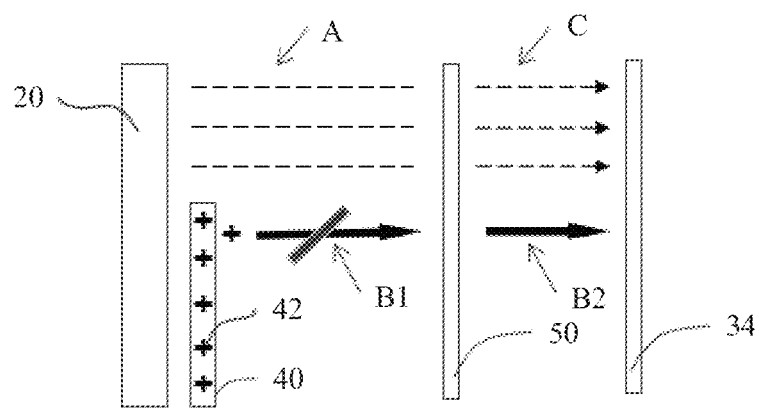
FIG. 5 is a diagram of distribution of electric fields of a package structure in an implementation of the present invention.

As shown in FIG. 4, in an implementation, the charged particles 42 in the bonding layer 40 are positive ions, the potential of the electrode 34 on the surface of the die 30 away from the bonding layer 40 is negative, and in this case, the first shielding structure 50 selects to be connected to a structure whose potential is zero in the package structure 100. In an implementation, the structure whose potential is zero is a die grounding element 36 (not marked in FIG. 4) disposed on the surface of the die 30 away from the bonding layer 40. The first shielding structure 40 is connected to the die grounding element 36 by using a leading wire 52, so that the first shielding structure 50 and the die grounding element 36 enclose the electrode 34, and a new electric field (as shown in FIG. 5) is generated. In this case, the potentials of the substrate 20 and the first shielding structure 50 are both zero. Therefore, a direction of the electric field between the substrate 20 and the first shielding structure 50 is shown as A in FIG. 5. Electric field lines are equipotential lines. Therefore, the charged particles 42 in the bonding layer 40 do not move from the bonding layer 40 to the first shielding structure 50 under an effect of the electric field. The first shielding structure 50 and the die grounding element 36 together enclose the electrode 34. Therefore, no charged particle 42 can bypass the first shielding structure 40 to migrate from the bonding layer 40 to the electrode 34.

Figure 6:
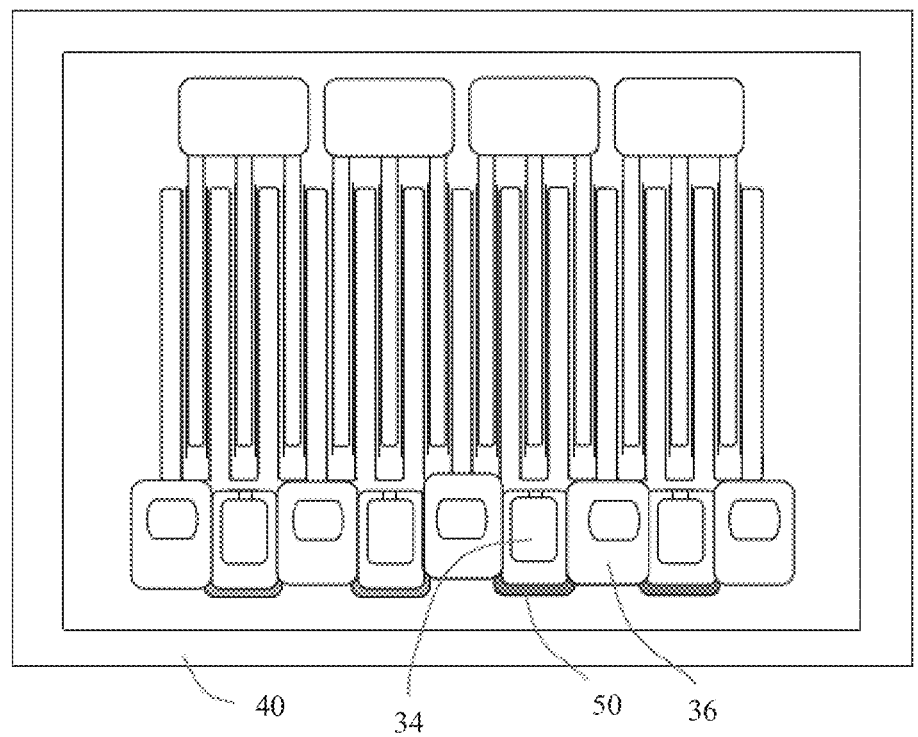
FIG. 6 is a diagram of distribution of a first shielding structure in an implementation of the present invention.

In an implementation, as shown in FIG. 6, there are two or more electrodes 34, there are a plurality of die grounding elements 36, the electrodes 34 are disposed between adjacent die grounding elements 36 at intervals, and the leading wire 52 is connected between two adjacent die grounding elements 36. To be specific, each electrode 34 is enclosed by the first shielding structure 50 and the die grounding elements 36.

Figure 7:
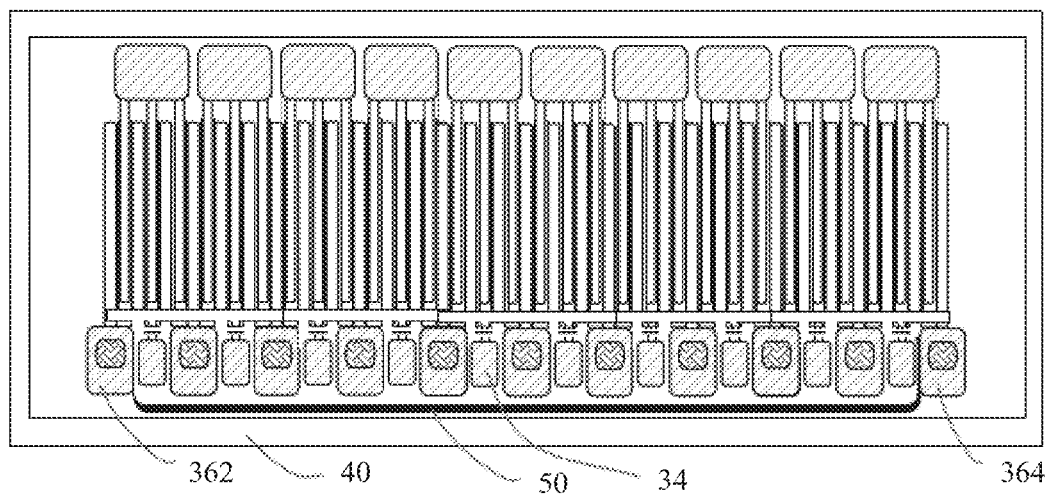
FIG. 7 is another diagram of distribution of a first shielding structure in an implementation of the present invention.

In an implementation, as shown in FIG. 7, there are a plurality of electrodes 34, there are at least two die grounding elements 36, the electrodes 34 and the die grounding elements 36 are arranged in a same row, the die grounding elements 36 include a first element 362 and a second element 364 respectively distributed at a row head and a row end, the first element 362 is electrically connected to the second element 364 by using the leading wire 52, to form the first shielding structure 50. The first shielding structure 50 enclosing peripheries of all the electrodes 34 will change distribution of electric fields near the package structure 100, thereby suppressing migration of the charged particles 42.

Figure 8:
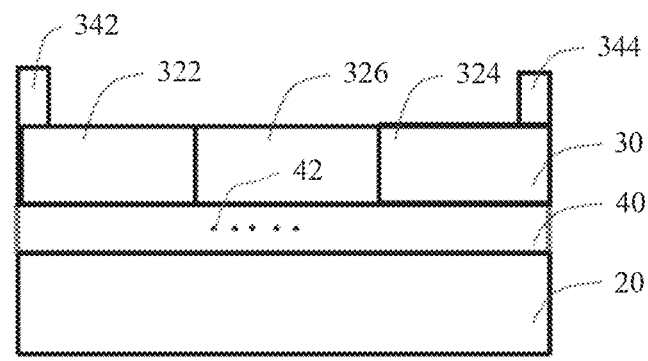
FIG. 8 is a schematic structural diagram of a package structure in an implementation of the present invention.

In an implementation, as shown in FIG. 8, the surface of the die 30 away from the bonding layer 40 includes a gate region 322, a drain region 324, and an active region 326, the active region 326 is disposed between the gate region 322 and the drain region 324, the electrodes 34 and the die grounding elements 36 are distributed in the gate region 322, the electrodes 34 are gate electrodes 342 in the gate region 322 for inputting a radio frequency signal, a drain electrode 344 is disposed in the drain region 324, and the drain electrode 344 is used for outputting a radio frequency signal amplified by the active region 326.

Figure 9:
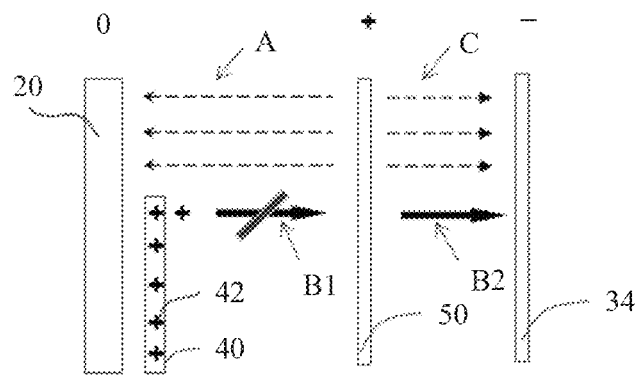
FIG. 9 is a diagram of distribution of electric fields of a package structure in another implementation of the present invention.

In an implementation, the charged particles 42 are positive ions, the potential of the electrode 34 is negative, and the first shielding structure 50 is connected to a positive potential in the package structure 100. In this case, due to intervention of the first shielding structure 50, distribution of electric fields around the package structure 100 is shown in FIG. 9. Because the first shielding structure 50 is connected to the positive potential, distribution of electric fields between the first shielding structure 50 and the substrate 20 is shown as A: A direction of the electric field is from the first shielding structure 50 to the substrate 20. Under an effect of the electric field, positively charged particles 42 do not move from the bonding layer 40 to the first shielding structure 50. Therefore, the charged particles 42 do not migrate toward the electrode 34.

Figure 10:
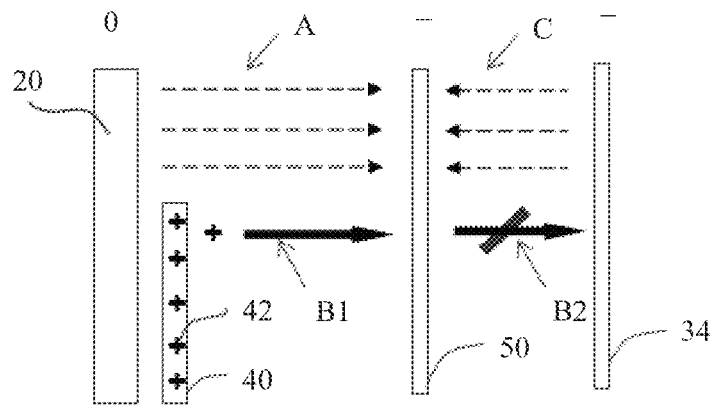
FIG. 10 is a diagram of distribution of electric fields of a package structure in another implementation of the present invention.

In an implementation, the charged particles 42 are positive ions, the potential of the electrode 34 is negative, the first shielding structure 50 is connected to a negative potential in the package structure 100, and a potential of the negative potential is lower than the potential of the electrode 34. In this case, due to intervention of the first shielding structure 50, distribution of electric fields around the package structure 100 is shown in FIG. 10. Because the first shielding structure 50 is connected to the negative potential, and the potential of the negative potential is lower than the potential of the electrode 34, distribution of electric fields between the first shielding structure 50 and the electrode 34 is shown as C: Although the charged particles 42 move from the bonding layer 40 to the first shielding structure 50 under an effect of the electric field, the electric field between the electrode 34 and the first shielding structure 50 suppresses movement of the charged particles 42 from the first shielding structure 50 to the electrode 34.

Figure 11:
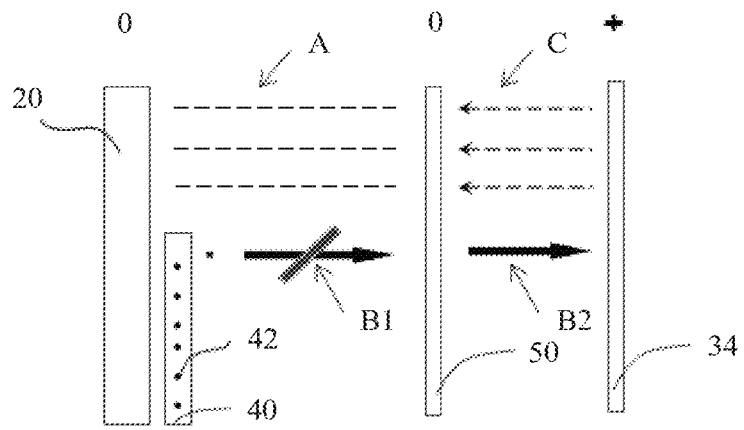
FIG. 11 is a diagram of distribution of electric fields of a package structure in another implementation of the present invention.

In an implementation, the charged particles 42 are negative ions, the potential of the electrode 34 is positive, and the first shielding structure 50 is connected to a zero potential in the package structure 100. In this case, due to intervention of the first shielding structure 50, distribution of electric fields around the package structure 100 is shown in FIG. 11. Because the first shielding structure 50 is connected to the zero potential, potentials of the first shielding structure 50 and the substrate 20 are equal, and electric field lines between the first shielding structure 50 and the substrate 20 are equipotential lines A, the negatively charged particles 42 do not move from the bonding layer 40 to the first shielding structure 50. Therefore, the charged particles 42 do not migrate toward the electrode 34.

Figure 12:
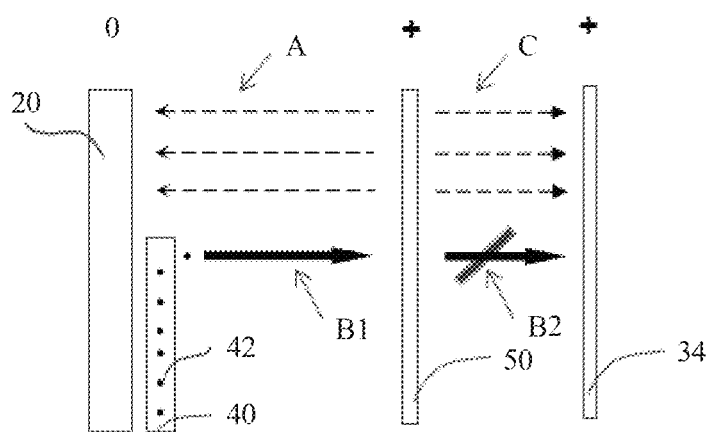
FIG. 12 is a diagram of distribution of electric fields of a package structure in another implementation of the present invention.

In an implementation, the charged particles 42 are negative ions, the potential of the electrode 34 is positive, the first shielding structure 50 is connected to a positive potential in the package structure 100, and a potential of the positive potential is higher than the potential of the electrode 34. In this case, due to intervention of the first shielding structure 50, distribution of electric fields around the package structure 100 is shown in FIG. 12. Because the first shielding structure 50 is connected to the positive potential, and the potential of the positive potential is higher than the potential of the electrode 34, distribution of electric fields between the first shielding structure 50 and the electrode 34 is shown as C. The charged particles 42 move from the bonding layer 40 to the first shielding structure 50 under an effect of the electric field. However, the electric field between the first shielding structure 50 and the electrode 34 suppresses movement of negatively charged particles 42 from the first shielding structure 50 to the electrode 34.

Figure 13:
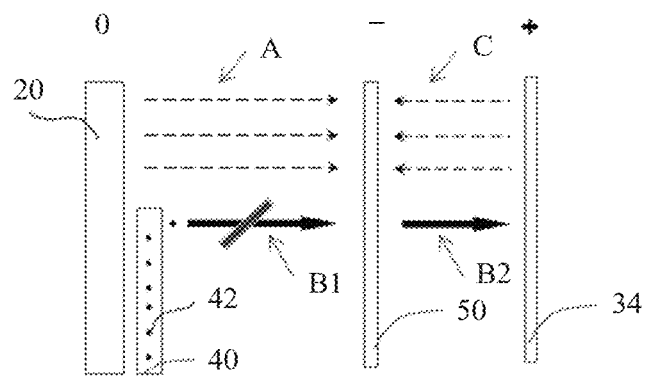
FIG. 13 is a diagram of distribution of electric fields of a package structure in another implementation of the present invention.

In an implementation, the charged particles 42 are negative ions, the potential of the electrode 34 is positive, and the first shielding structure 50 is connected to a negative potential in the package structure 100. In this case, due to intervention of the first shielding structure 50, distribution of electric fields around the package structure 100 is shown in FIG. 13. Because the first shielding structure 50 is connected to the negative potential, a direction of the electric field between the first shielding structure 50 and the substrate 20 is shown as A. Under an effect of the electric field, negatively charged particles 42 move only from the bonding layer 40 to the substrate 20, and do not move toward the first shielding structure 50. Therefore, the charged particles 42 do not migrate toward the electrode 34.

Figure 14:
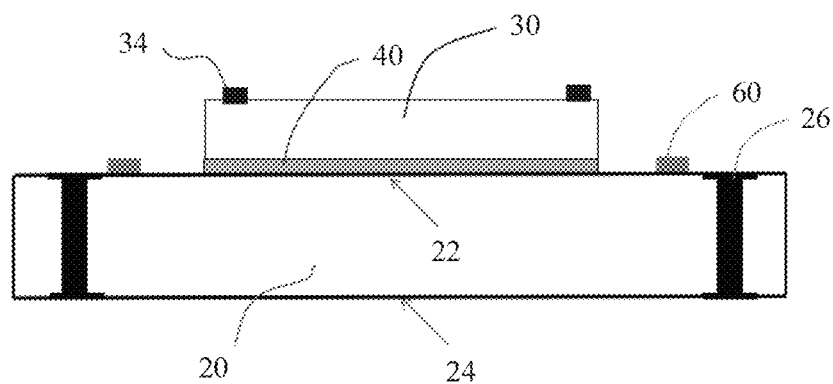
FIG. 14 is a schematic diagram of a package structure in another implementation of the present invention.

In an implementation, as shown in FIG. 14, the substrate 20 includes an upper surface 22 and a lower surface 24, the die 30 is bonded to the upper surface 22 by using the bonding layer 40, a pin 26 is further disposed on the substrate 20, the pin 26 extends from the upper surface to the lower surface 24, the pin 26 is electrically connected to the electrode 34, the package structure 100 further includes a second shielding structure 60, and the second shielding structure 60 is disposed on the upper surface 22 and is located between the bonding layer 40 and the pin 26, to prevent the charged particles 42 from migrating to the pin 26. Because the pin 26 is electrically connected to the electrode 34, a potential of the pin 26 is the same as that of the electrode 34, and is opposite to that of the charged particle 42 in the bonding layer 40. Distribution of electric fields between the pin 26 and the bonding layer 40 is destroyed by disposing the second shielding structure 60 on the substrate, to prevent migration of the charged particles 42 toward the pin 26.

Figure 15:
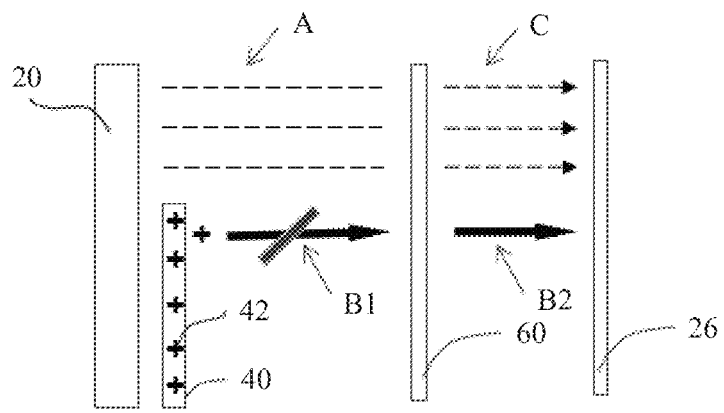
FIG. 15 is a diagram of distribution of electric fields of a package structure in another implementation of the present invention.

In an implementation, the charged particles 42 in the bonding layer 40 are positive ions, a potential of the pin 26 is negative, and the second shielding structure 60 is connected to a zero potential in the package structure 100. In an implementation, a substrate grounding element 28 is distributed on the upper surface 22 of the substrate 20, and the second shielding structure 60 is connected to the substrate grounding element 28 by using a connecting line 62. In this case, distribution of electric fields of the package structure 100 is shown in FIG. 15. The second shielding structure 60 is connected to the substrate grounding element 28 by using the connecting line 62. A potential of the second shielding structure 60 is zero. Therefore, potentials of the second shielding structure 60 and the substrate 20 are equal. Electric field lines between the second shielding structure 60 and the substrate 20 are shown as A, and are equipotential lines. The charged particles 42 do not move under an effect of the electric field. Therefore, the charged particles 42 do not migrate from the bonding layer 40 to the pin 26.

Figure 16:
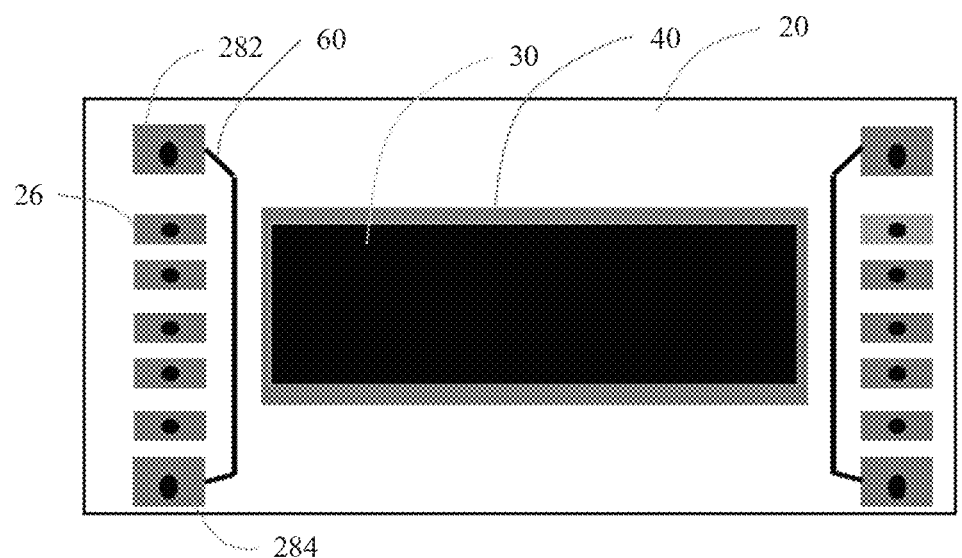
FIG. 16 is a diagram of distribution of a second shielding structure in another implementation of the present invention.

In an implementation, as shown in FIG. 16, there are a plurality of pins 26 in the package structure 100, there are at least two substrate grounding elements 28, the pins 26 and the substrate grounding elements 28 are arranged in a same row, the substrate grounding elements 28 include a head element 282 and an end element 284 respectively distributed at a row head and a row end, the connecting line 62 is electrically connected between the head element 282 and the end element 284, and the head element 282, the connecting line 62, and the end element 284 together enclose peripheries of all the pins 26.

Figure 17:
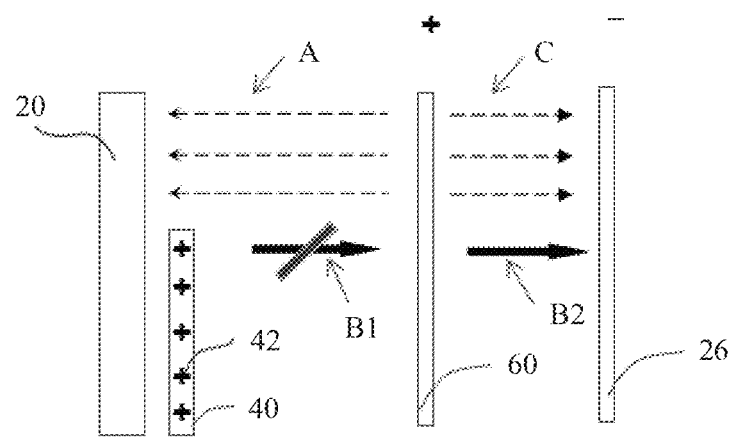
FIG. 17 is a diagram of distribution of electric fields of a package structure in another implementation of the present invention.

In an implementation, the charged particles 42 in the bonding layer 40 are positive ions, a potential of the pin 26 is negative, and the second shielding structure 60 is connected to a positive potential in the package structure 100. In this case, due to intervention of the second shielding structure 60, distribution of electric fields around the package structure 100 is shown in FIG. 17. Because the second shielding structure 50 is connected to the positive potential, distribution of electric fields between the second shielding structure 50 and the substrate 20 is shown as A: A direction of the electric field is from the second shielding structure 50 to the substrate 20. Under an effect of the electric field, positively charged particles 42 do not move from the bonding layer 40 to the second shielding structure 50. Therefore, the charged particles 42 do not migrate toward the electrode 34.

Figure 18:
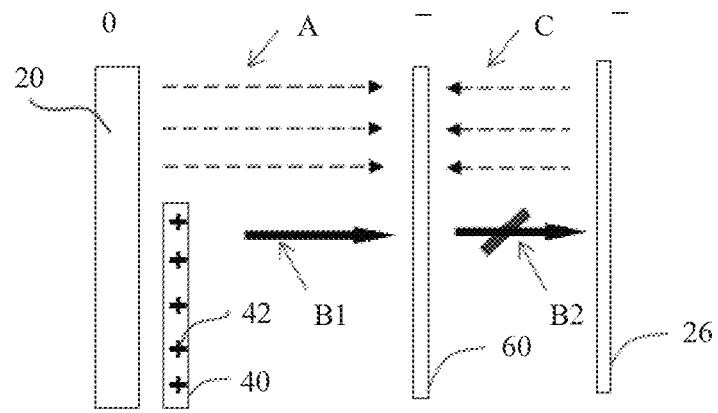
FIG. 18 is a diagram of distribution of electric fields of a package structure in another implementation of the present invention.

In an implementation, the charged particles 42 are positive ions, a potential of the pin 26 is negative, the second shielding structure 60 is connected to a negative potential in the package structure 100, and a potential of the negative potential is lower than the potential of the pin 26. In this case, due to intervention of the second shielding structure 60, distribution of electric fields around the package structure 100 is shown in FIG. 18. Because the second shielding structure 60 is connected to the negative potential, and the potential of the negative potential is lower than the potential of the pin 26, distribution of electric fields between the second shielding structure 60 and the pin 26 is shown as C. The charged particles 42 move from the bonding layer 40 to the second package structure 60 under an effect of the electric field. However, the electric field between the pin 26 and the second shielding structure 60 suppresses movement of positively charged particles 42 from the second shielding structure 60 to the pin 26.

Figure 19:
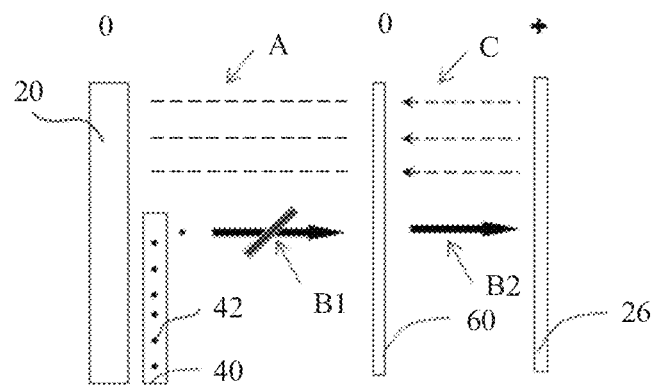
FIG. 19 is a diagram of distribution of electric fields of a package structure in another implementation of the present invention.

In an implementation, the charged particles 42 are negative ions, a potential of the pin 26 is positive, and the second shielding structure 60 is connected to a zero potential in the package structure 100. In this case, due to intervention of the second shielding structure 60, distribution of electric fields around the package structure 100 is shown in FIG. 19. Because the second shielding structure 60 is connected to the zero potential, potentials of the second shielding structure 60 and the substrate 20 are equal, and electric field lines between the second shielding structure 60 and the substrate 20 are equipotential lines A, the negatively charged particles 42 do not move from the bonding layer 40 to the second shielding structure 60. Therefore, the charged particles 42 do not migrate toward the electrode 34.

Figure 20:
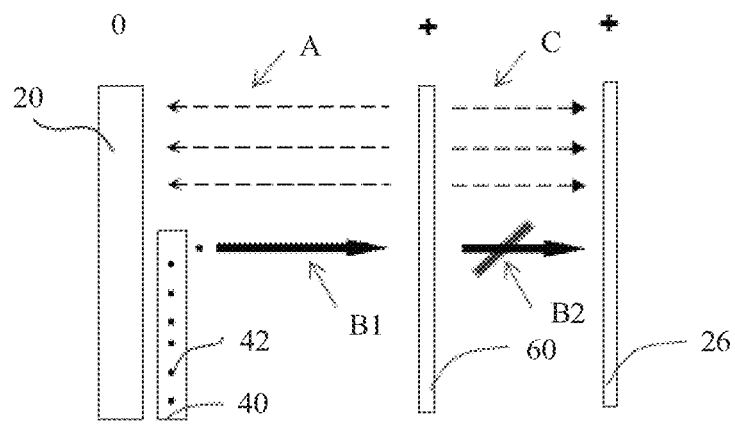
FIG. 20 is a diagram of distribution of electric fields of a package structure in another implementation of the present invention.

In an implementation, the charged particles 42 are negative ions, a potential of the pin 26 is positive, the second shielding structure 60 is connected to a positive potential in the package structure 100, and a potential of the positive potential is higher than the potential of the pin 26. In this case, due to intervention of the second shielding structure 60, distribution of electric fields around the package structure 100 is shown in FIG. 20. Because the second shielding structure 60 is connected to the positive potential, and the potential of the positive potential is higher than the potential of the pin 26, distribution of electric fields between the second shielding structure 60 and the pin 26 is shown as C. Due to existence of the electric field, the charged particles 42 move from the bonding layer 40 to the second shielding structure 60. However, the electric field between the second shielding structure 60 and the pin 26 suppresses movement of negatively charged particles 42 from the second shielding structure 60 to the pin 26.

Figure 21:
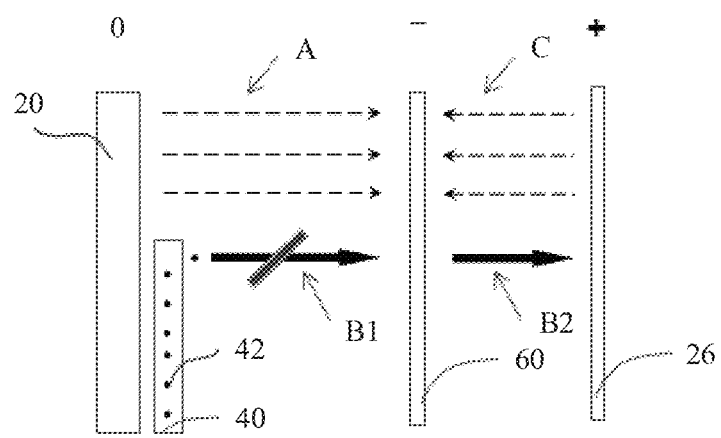
FIG. 21 is a diagram of distribution of electric fields of a package structure in another implementation of the present invention.

In an implementation, the charged particles 42 are negative ions, a potential of the pin 26 is positive, and the second shielding structure 60 is connected to a negative potential in the package structure 100. In this case, due to intervention of the second shielding structure 60, distribution of electric fields around the package structure 100 is shown in FIG. 21. Because the second shielding structure 60 is connected to the negative potential, a direction of the electric field between the first shielding structure 50 and the substrate 20 is shown as A. Under an effect of the electric field, negatively charged particles 42 move from the bonding layer 40 to the second shielding structure 60. Therefore, the charged particles 42 do not migrate toward the electrode 34.

In an embodiment, to enhance a shielding effect of the first shielding structure 50, passivation may be performed on a surface of the first shielding structure 50, to form a passivation layer on the surface of the first shielding structure 50. To be specific, the package structure of this application includes a passivation layer, where the passivation layer covers the first shielding structure. Stability of a material of the first shielding structure can be ensured by covering the passivation layer on the surface of the first shielding structure.

The foregoing descriptions are merely specific implementations of the present invention, but are not intended to limit the protection scope of the present invention. Any variation or replacement readily figured out by a person skilled in the art within the technical scope disclosed in the present invention shall fall within the protection scope of the present invention. Therefore, the protection scope of the present invention shall be subject to the protection scope of the claims.

What is claimed is:

1. A package structure, comprising:
a substrate;
a die;
a first shielding structure;
a second shielding structure; and
a bonding layer bonding the die to the substrate, wherein charged particles are disposed in the bonding layer, a first electrode is disposed on a surface of the die that faces away from the bonding layer, a potential of the first electrode is opposite to a potential of the charged particles, a potential of the substrate is zero, the first shielding structure is located on an outer surface of the die and is disposed between the bonding layer and the first electrode; and
wherein the substrate comprises an upper surface and a lower surface, the die is bonded to the upper surface using the bonding layer, a pin is disposed in the substrate, the pin extends from the upper surface to the lower surface, the pin is electrically connected to the first electrode, and the second shielding structure is disposed on the upper surface and is disposed between the bonding layer and the pin.

2. The package structure according to claim 1, wherein the charged particles are positive ions, the potential of the first electrode is negative, and the first shielding structure is connected to a zero potential in the package structure.

3. The package structure according to claim 2, wherein a first die grounding element is disposed on the surface of the die that faces away from the bonding layer, the first shielding structure comprises a leading wire electrically connected to the first die grounding element, and the leading wire and the first die grounding element in combination form a barrier strip between the bonding layer and the first electrode.

4. The package structure according to claim 3, further comprising a second electrode and a second die grounding element, wherein the first electrode is disposed between the first die grounding element and the second die grounding element, and the leading wire is electrically connected between the first die grounding element and the second die grounding element.

5. The package structure according to claim 3, further comprising a second electrode and a second die grounding element, wherein the first electrode, the second electrode, the first die grounding element, and the second die grounding element are arranged in a same row, the first die grounding element and the second die grounding element are respectively distributed at a row head and a row end, the leading wire is electrically connected between the first die grounding element and the second die grounding element, and the first die grounding element, the leading wire, and the second die grounding element in combination enclose peripheries of the first electrode and the second electrode.

6. The package structure according to claim 3, wherein the surface of the die that faces away from the bonding layer comprises a gate region, a drain region, and an active region, the active region is disposed between the gate region and the drain region, the first electrode and the first die grounding element are distributed in the gate region, the first electrode is a gate electrode in the gate region configured to be used to input a radio frequency signal, a drain electrode is disposed in the drain region, and the drain electrode is configured to be used to output a radio frequency signal amplified by the active region.

7. The package structure according to claim 1, wherein the charged particles are positive ions, the potential of the first electrode is negative, and the first shielding structure is connected to a positive potential in the package structure.

8. The package structure according to claim 1, wherein the charged particles are positive ions, the potential of the first electrode is negative, the first shielding structure is connected to a negative potential in the package structure, and a potential of the negative potential is lower than the potential of the first electrode.

9. The package structure according to claim 1, wherein the charged particles are negative ions, the potential of the first electrode is positive, and the first shielding structure is connected to a zero potential in the package structure.

10. The package structure according to claim 1, wherein the charged particles are negative ions, the potential of the first electrode is positive, the first shielding structure is connected to a positive potential in the package structure, and a potential of the first shielding structure is higher than the potential of the first electrode.

11. The package structure according to claim 1, wherein the charged particles are negative ions, the potential of the first electrode is positive, and the first shielding structure is connected to a negative potential in the package structure.

12. The package structure according to claim 1, wherein the charged particles are positive ions, a potential of the pin is negative, and the second shielding structure is connected to a zero potential in the package structure.

13. The package structure according to claim 1, wherein the charged particles are positive ions, a potential of the pin is negative, and the second shielding structure is connected to a positive potential in the package structure.

14. The package structure according to claim 1, wherein the charged particles are positive ions, a potential of the pin is negative, the second shielding structure is connected to a negative potential in the package structure, and a potential of the negative potential is lower than the potential of the first electrode.

15. The package structure according to claim 1, wherein the charged particles are negative ions, a potential of the pin is positive, and the second shielding structure is connected to a zero potential in the package structure.

16. The package structure according to claim 1, wherein the charged particles are negative ions, a potential of the pin is positive, the second shielding structure is connected to a positive potential in the package structure, and a potential of the positive potential is higher than the potential of the first electrode.

17. The package structure according to claim 1, wherein the charged particles are negative ions, a potential of the pin is positive, and the second shielding structure is connected to a negative potential in the package structure.

18. The package structure according to claim 1, further comprising a passivation layer, wherein the passivation layer covers the first shielding structure.

19. A communications device, comprising:
    a radio frequency passive device;
    a radio frequency small signal device; and
    a package structure connected between the radio frequency small signal device and the radio frequency passive device, wherein the package structure comprises:
    a substrate;
    a die;
    a first shielding structure; and
    a bonding layer bonding the die to the substrate, wherein charged particles are disposed in the bonding layer, a first electrode is disposed on a surface of the die that faces away from the bonding layer, a potential of the first electrode is opposite to a potential of the charged particle, a potential of the substrate is zero, and the first shielding structure is located on an outer surface of the die and is disposed between the bonding layer and the first electrode.

20. The communications device according to claim 19, wherein the charged particles are positive ions, the potential of the first electrode is negative, and the first shielding structure is connected to a zero potential in the package structure.

\* \* \* \* \*